United States Patent [19]
Peterson

[11] Patent Number: 5,914,630
[45] Date of Patent: Jun. 22, 1999

[54] MR HEAD PREAMPLIFIER WITH OUTPUT SIGNAL AMPLITUDE WHICH IS INDEPENDENT OF HEAD RESISTANCE

[75] Inventor: Douglas R. Peterson, Minnetonka, Minn.

[73] Assignee: VTC Inc., Bloomington, Minn.

[21] Appl. No.: 08/853,441

[22] Filed: May 9, 1997

Related U.S. Application Data

[60] Provisional application No. 60/017,534, May 10, 1996.

[51] Int. Cl.$^6$ .............................. H01L 35/00; G06G 7/12
[52] U.S. Cl. ............................ 327/513; 327/65; 327/563
[58] Field of Search .................................. 327/512, 513, 327/63–65, 77, 83, 89, 560–563

[56] References Cited

U.S. PATENT DOCUMENTS

| | | | |
|---|---|---|---|
| 3,814,863 | 6/1974 | O'Day et al. | 360/113 |
| 3,898,486 | 8/1975 | Wessel et al. | 327/561 |
| 4,040,113 | 8/1977 | Gorter | 360/113 |
| 4,050,086 | 9/1977 | Harr | 360/66 |
| 4,191,977 | 3/1980 | Lewkowicz | 360/66 |
| 4,323,854 | 4/1982 | Hester | 327/512 |
| 4,492,997 | 1/1985 | Arai et al. | 360/113 |
| 4,520,311 | 5/1985 | Petr et al. | 324/117 |
| 4,580,178 | 4/1986 | Wuori et al. | 360/67 |
| 4,706,138 | 11/1987 | Jove et al. | 360/67 |
| 4,712,144 | 12/1987 | Klaassen | 360/67 |
| 4,716,306 | 12/1987 | Sato et al. | 307/296 |
| 4,728,902 | 3/1988 | Gleason et al. | 330/261 |
| 4,743,861 | 5/1988 | Jove et al. | 330/260 |
| 4,786,993 | 11/1988 | Jove et al. | 360/67 |
| 4,833,559 | 5/1989 | Belk | 360/113 |
| 4,879,610 | 11/1989 | Jove et al. | 360/67 |
| 4,914,398 | 4/1990 | Jove et al. | 328/167 |
| 5,032,935 | 7/1991 | Jove et al. | 360/67 |
| 5,103,353 | 4/1992 | Jove et al. | 360/67 |
| 5,122,915 | 6/1992 | Klein et al. | 360/113 |
| 5,204,789 | 4/1993 | Jove et al. | 360/67 |
| 5,229,894 | 7/1993 | Collins et al. | 360/43 |
| 5,235,472 | 8/1993 | Smith | 360/60 |
| 5,278,700 | 1/1994 | Sutliff et al. | 360/46 |
| 5,301,080 | 4/1994 | Ottesen et al. | 360/113 |
| 5,309,295 | 5/1994 | Bailey et al. | 360/66 |
| 5,323,278 | 6/1994 | Contreras et al. | 360/67 |
| 5,327,297 | 7/1994 | Enami et al. | 360/66 |
| 5,327,303 | 7/1994 | Smith | 360/67 |
| 5,357,388 | 10/1994 | Smith | 360/113 |
| 5,483,184 | 1/1996 | Kuo | 327/563 |

*Primary Examiner*—Toan Tran
*Attorney, Agent, or Firm*—Kinney & Lange, P.A.

[57] ABSTRACT

A preamplifier circuit, which produces an output signal representative of signals from a magnetoresistive read head, includes a current bias circuit for providing a bias current to the read head, and first and second amplifiers for amplifying signals from the read head. The first amplifier, with an input for coupling to the read head, outputs first signals representative of changes in head resistance. The first signals have an amplitude substantially independent of the head resistance and proportional to a temperature dependent characteristic of the first amplifier. The second amplifier, which is coupled to the first amplifier, outputs a second signal having an amplitude proportional to the amplitude of the first signals and inversely proportional to the temperature dependent characteristic. Thus, the amplitude of the second signal is substantially independent of head resistance and the temperature dependent characteristic.

14 Claims, 3 Drawing Sheets they prevent
MR HEAD PREAMPLIFIER WITH OUTPUT SIGNAL AMPLITUDE WHICH IS INDEPENDENT OF HEAD RESISTANCE This application is based on provisional application Ser. No. 60/017,534, filed May 10, 1996. Priority of the provisional application is claimed pursuant to 35 USC § 119.

BACKGROUND OF THE INVENTION

The present invention pertains to preamplifiers for magnetoresistive elements of mass data storage systems, particularly magnetic storage systems.

A typical high-performance magnetic storage system includes a magnetic disc for storing data, an inductive write element for writing data to the disc, and a magnetoresistive read element for reading, or retrieving, data from the disc. The write element writes binary data to the disc by magnetizing tiny regions of the disc to represent a sequence of ones and zeroes. The magnetoresistive (MR) read element has an electrical resistance that changes according to the magnetization of the tiny regions as they move past the MR element. These resistance changes are then translated initially to an electrical data signal and ultimately to the original binary data.

Translating the resistance changes to an appropriate electrical signal entails coupling the MR element to an electric circuit, known as a preamplifier. The preamplifier typically includes a current bias circuit that converts the resistance changes to a voltage signal and an amplifier circuit that amplifies, or scales, the voltage signal before outputting the resulting data signal to detection circuitry for further processing.

Specifically, the current bias circuit forces a constant bias current Ib through the MR element (or head), to establish a nominal (steady-state or DC) bias voltage, Vb, across the element. The bias voltage, Vb, which equals the product of the intrinsic head resistance Rh and the magnitude of bias current Ib (RhIb), serves as a constant electrical background for sensing the resistance changes. The resistance changes cause momentary positive or negative pulse-like variations in the head voltage. The amplitude of these pulse-like variations equals the product of the bias voltage (Vb or IbRh) and a constant factor k, or kIbRh. The constant factor k represents the percentage change in head resistance Rh caused by the magnetized regions.

The amplifier circuit of the preamplifier amplifies the pulse-like variations by a constant factor G, known as the gain of the preamplifier. The amplitude of the resulting voltage signal Vout equals the product of the gain G and the amplitude of the pulse-like variations, or GkIbRh. Thus, the typical preamplifier with constant-current biasing produces an output voltage signal Vout with an amplitude that depends not only on the gain G of the preamplifier, the percentage change in head resistance k, and the bias current Ib, but also on the head resistance Rh.

The dependence of the output amplitude on head resistance Rh is troublesome for two reasons. First, it is common, in multi-disc, multi-head storage systems, to use several MR elements with the same preamplifier. MR elements, which are quite small and thus difficult to manufacture, inevitably have unique resistances which vary significantly from each other, sometimes by a factor of three or more. Thus, because of its dependence on head resistance, switching from one MR element to another changes the amplitude of the output signal by a corresponding factor. Second, head resistance also varies with temperature, age, and wear. Thus, even in systems with only one MR element, the output amplitude still varies because of changing head resistance. Amplitude variations are highly undesirable because they prevent detection circuitry from performing consistently with the signals from each MR element.

Additionally, the dependence of the output amplitude on the preamplifier gain G can also be troublesome. Although the preamplifier gain G should ideally be constant, it may vary with temperature changes in the preamplifier. Gain variance ultimately stems from the effect of temperature on transistors in the amplifier circuit. This gain variance is undesirable because it changes the amplitude of the output signal, as the preamplifier warms and cools during its operation. Thus, gain variance also undermines consistent performance of the detection circuitry.

Therefore, to promote consistent performance of magnetic storage systems using magnetoresistive read heads, there is a need for a constant-current preamplifier having an output signal amplitude not only independent of head resistance, but also independent of temperature.

SUMMARY OF THE INVENTION

Accordingly, the present invention is a preamplifier circuit that provides an output signal having an amplitude substantially independent of head resistance and temperature.

Specifically, the preamplifier circuit, which produces an output signal representative of signals from a magnetoresistive read head, includes a current bias circuit for providing a bias current to the read head and first and second amplifiers for amplifying signals from the read head. The first amplifier, with an input for coupling to the read head, outputs first signals representative of changes in head resistance. The first signals have an amplitude substantially independent of the head resistance and proportional to a temperature dependent characteristic of the first amplifier. The second amplifier, which is coupled to the first amplifier, outputs second signals having an amplitude proportional to the amplitude of the first signals and inversely proportional to the temperature dependent characteristic. Thus, the amplitude of the second signals is substantially independent of head resistance and the temperature dependent characteristic.

DETAILED DESCRIPTION OF THE PREFERRED EMBODIMENTS

Figure 1:
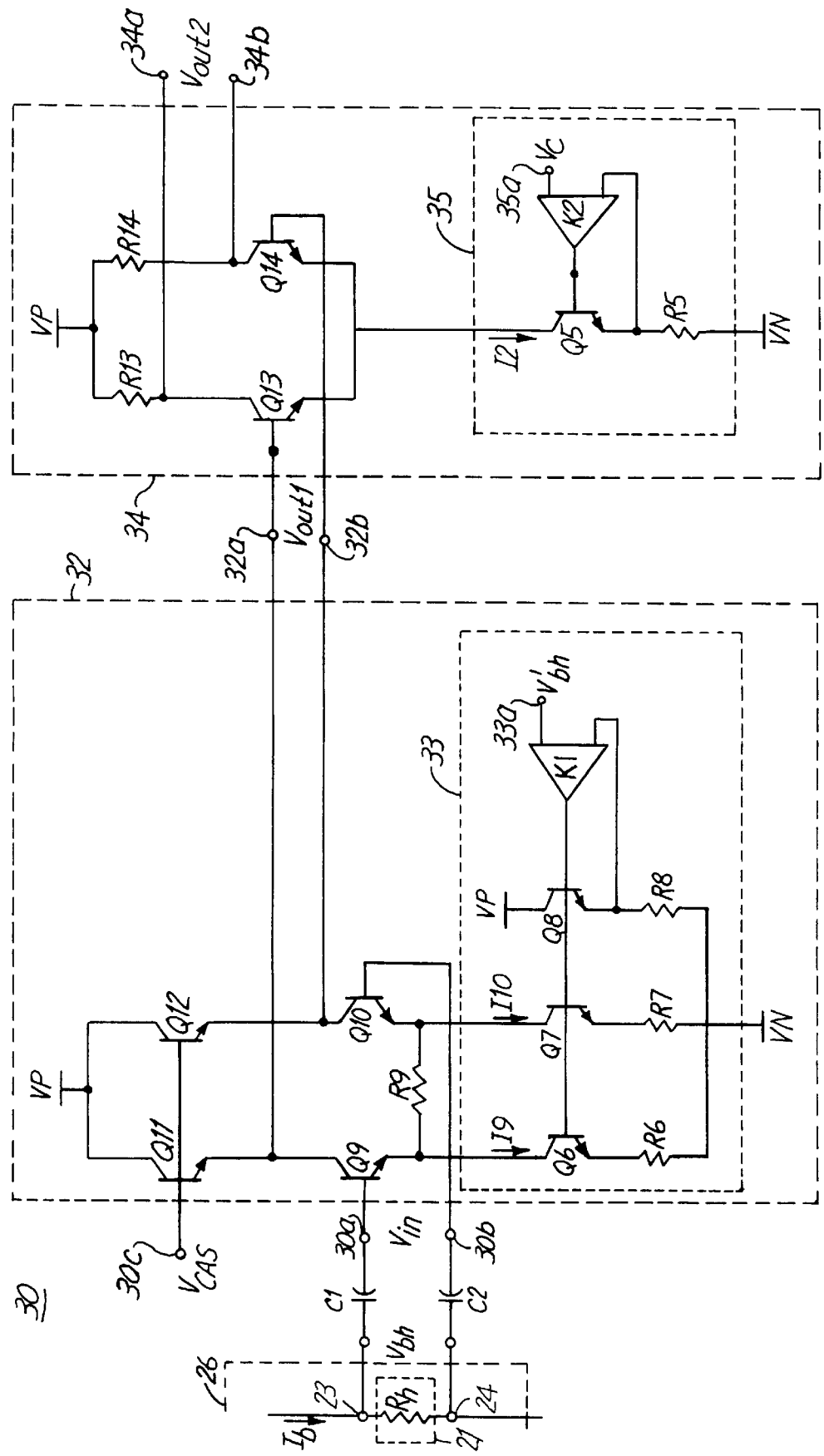
FIG. 1 is an electrical schematic of a preferred embodiment of a constant-current biasing preamplifier incorporating the teachings of the present invention.

FIG. 1 shows a constant-current preamplifier 20 for a magnetoresistive (MR) element 21. (Although FIG. 1 illustrates only one MR element, any number of MR elements can be accommodated with well-known switching techniques.) MR element 21, shown coupled between head pins or nodes 23 and 24, has a head resistance Rh. Preamplifier 20 includes respective positive and negative voltage supply pins (or nodes) VP and VN which preferably provide respective voltages VP and VN of +5 and 0 (ground) volts.

Preamplifier 20 also includes a current bias circuit 26 and an amplifier circuit 30.

Current bias circuit 26 provides a bias current Ib (preferably between 6 and 16 milliamperes) to MR element 21, thereby establishing a substantially-constant (DC, quiescent, or steady-state) bias voltage Vb across the MR element and between head pins 23 and 24. Consequently, changes in head resistance Rh will produce a voltage signal Vin having an amplitude Ain defined as $$Ain = kVb = kIbRh \tag{1}$$

where k represents the percentage change in head resistance Rh. (k is typically about two percent.) Head pins 23 and 24 are coupled via coupling capacitors C1 and C2 to inputs 30a and 30b of amplifier circuit 30, to isolate circuit 30 from bias voltage Vb and to transmit voltage signal Vin to the inputs. Preferably, capacitors C1 and C2 are substantially identical.

Amplifier circuit 30 comprises a first-stage amplifier subcircuit 32 and a second-stage amplifier subcircuit 34. The first-stage amplifier includes inputs 30a and 30b, transistors Q9–Q12, a resistor R9, an adjustable current generator subcircuit 33, and outputs 32a and 32b. Transistors Q9–Q12 (and in fact, all the transistors in this description) are preferably npntype bipolar junction transistors, each with three terminals or regions: a control region, called a base, and two controlled regions, called a collector and an emitter.

Each transistor has an associated thermal voltage Vt which defines its response to temperature changes. Thermal voltage Vt is approximately 26 millivolts at room temperature (81° F.). More generally, thermal voltage Vt is the product of temperature (in degrees Kelvin) and the ratio of the Boltzmann constant to the charge of an electron.

Transistors Q9 and Q10, which are preferably matched to promote symmetry, form an emitter-coupled differential pair, with their emitters coupled together via resistor R9 and their bases coupled respectively to inputs 30a and 30b. Resistor R9 provides emitter degeneration for transistors Q9 and Q10. The Q9 and Q10 emitters are coupled to the negative supply node VN via current generator subcircuit 33.

Subcircuit 33 generates matched bias currents I9 and I10, which have a magnitude I1 based on a reference voltage Vb' at a reference input 33a. Specifically, subcircuit 33 includes matched transistors Q6–Q8, matched resistors R6–R8, and operational amplifier K1. The Q6 and Q7 collectors are connected respectively to the Q9 and Q10 emitters, and the Q6 and Q7 emitters are connected via respective resistors R6 and R7 to negative supply node VN. The Q6 and Q7 bases are connected to the base of transistor Q8, to form two one-to-one current mirrors: one from transistor Q8 to transistor Q6 and the other from transistor Q8 to transistor Q7. Transistor Q8 has its emitter coupled to negative supply node VN via resistor R8, its collector coupled to positive supply node VP, and its base, or control region, coupled to the output of amplifier K1.

Amplifier K1 has two input, a negative input coupled to the Q8 emitter and a positive input connected to reference input 33a. Input 33a preferably receives a voltage Vb' based on bias voltage Vb (the product of head resistance Rh and bias current Ib). (Voltage Vb' preferably originates from voltage converter 36 in FIG. 2). Amplifier K1 forces transistor Q8 to generate a current I1 contingent on the ratio of voltage Vb' to resistor R6, or Vb'/R6. This current, mirrored respectively through transistors Q6 and Q8 to the Q9 and Q10 emitters, establishes linear biasing of transistors Q9 and Q10.

The Q9 and Q10 collectors are coupled to positive supply node VP via respective transistors Q11 and Q12. Thus, the Q11 and Q12 emitters are connected respectively to the Q9 and Q10 collectors, and the Q11 and Q12 collectors are connected to supply node VP. The Q11 and Q12 bases are connected to reference input 30c which preferably provides a substantially-constant reference voltage Vcas of approximately 2.5 volts to bias transistors Q11 and Q12. Transistors Q11 and Q12 form a cascode pair that reduces capacitance at inputs 30a and 30b and therefore increases the bandwidth of the first stage amplifier, enabling it to accurately amplify faster-changing, or higher-frequency, input signals than would otherwise be possible.

In particular, inputs 30a and 30b have an input capacitance attributable to the inherent capacitances of the base-collector pn junctions of transistors Q9 and Q10. Transistors Q11 and Q12 reduce input capacitance by reducing consequences of the Miller effect, which multiplies the inherent capacitances by a factor proportional to the collector resistances of transistors Q9 and Q10. Transistors Q11 and Q12 reduce the collector resistances, which in turn reduces the capacitance resulting from the Miller-effect multiplication.

In practice, first-stage amplifier subcircuit 32, which has respective outputs 32a and 32b at the Q9 and Q10 collectors, provides an output voltage signal Vout1 proportional to input voltage signal Vin and a gain G1 of the first-stage amplifier. Gain G1 is defined as $$G1 = 2\frac{r_{e11}}{R9} \tag{2}$$

where $r_{e11}$ represents the small-signal emitter resistances of matched transistors Q11 and Q12. $r_{e11}$ is the ratio of thermal voltage Vt to current I1 which biases transistors Q9 and Q10; current I1 is the ratio of voltage Vb' to resistor R8; and voltage Vb' is the product of bias current Ib and head resistance Rh. Thus, appropriate algebraic substitutions and manipulations yields an alternative expression for gain G1:

$$G1 = 2Vt\frac{R8}{R9IbRh} \tag{3}$$

And, since the output signal amplitude Vout1 of the first stage is the product of gain G1 and input voltage amplitude Ain, or kIbRh as shown in equation (1), output signal Vout1 has an amplitude A1:

$$A1 = 2kVt\frac{R8}{R9} \tag{4}$$

which is independent of head resistance Rh. Thus, the first stage provides an output signal amplitude which is independent of head resistance Rh.

However, since thermal voltage Vt varies with temperature, output amplitude A1 will also vary with temperature. Although this may be tolerable in some applications, it is generally undesirable because it undermines consistent performance of any detection circuitry coupled to the outputs. Thus, to remove this temperature dependence, the preferred embodiment includes a second amplifier stage that has a gain G2 inversely proportional to the thermal voltage Vt. Amplifier subcircuit 34 exemplifies such a stage.

Specifically, amplifier subcircuit 34 includes emitter-coupled transistors Q13 and Q14, with respective bases coupled to outputs 32a and 32b of the first amplifier stage, and respective collectors connected via matched resistors R13 and R14 to positive supply node VP. Subcircuit 34 also includes a current generator subcircuit 35, coupled between negative supply node VN and the Q13 and Q14 emitters, to linearly bias transistors Q13 and Q14. Current generator subcircuit 35, which preferably comprises transistor Q5, resistor R5, operational amplifier K2, and a reference voltage input 35a, generates a current I2 based on the ratio of reference voltage Vc (at input 35a) to resistor R5. The Q13 and Q14 collectors, which are connected to supply node VP via respective resistors R13 and R14, form outputs 34a and 34b of the second stage.

Amplifier subcircuit 34, the second-stage amplifier, provides an output voltage signal Vout2 proportional to output voltage Vout1 of the first stage and to a gain G2 of the second stage amplifier. Hence, the amplitude of voltage signal Vout2, A2, depends on the product of amplitude A1 (defined in equation (4)) and gain G2. In this embodiment, gain G2 defined as the ratio of resistor R13 to the small-signal emitter resistance $r_{e13}$ of matched transistors Q13 and Q14, is expressed as $$G2 = \frac{R13}{r_{e13}} \quad (5)$$

$r_{e13}$ is the ratio of thermal voltage Vt to current I2 which linearly biases transistors Q13 and Q14, and current I2 is the ratio of reference voltage Vc to resistor R5. Making these substitutions in equation (5) yields the following equivalent expression for gain G2:

$$G2 = Vc \frac{R13}{2R5Vt} \quad (6)$$

Accordingly, output signal amplitude A2, the product of gain G2 and amplitude A1, is $$A2 = kVc \frac{R8R13}{R9R5} \quad (7)$$

Thus, output signal amplitude A2 is not only independent of head resistance Rh but also independent of the thermal voltage of the transistors forming the amplifier. Moreover, since voltage Vc may be either an internally-generated bandgap reference, or an externally-generated reference, amplifier 30 provides a specific input, namely input 35a, for adjusting output signal amplitude A2.

Figure 2:
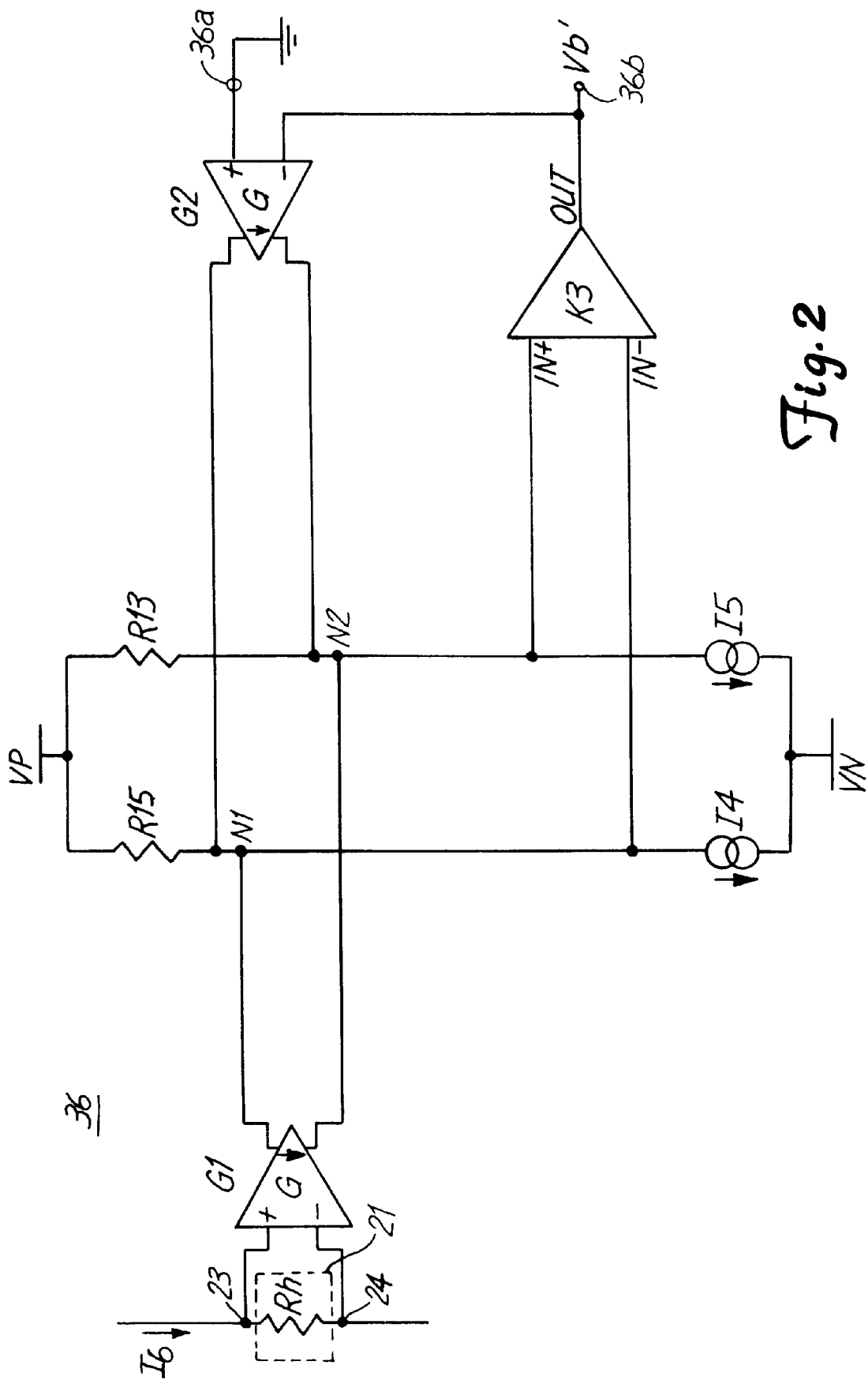
FIG. 2 is an electrical schematic of a preferred embodiment of a voltage converter which derives reference voltage Vb' in FIG. 1.

FIG. 2 shows the preferred embodiment of voltage converter 36 which converts bias voltage at head pins 23 and 24, a differential voltage or two-ended voltage, to reference voltage Vb', a single-ended ground reference voltage. Voltage converter 36 includes transconductance amplifiers G1 and G2, matched current sources I4 and I5, matched resistors R15 and R16, operational amplifier K3, reference voltage input 36a, and output 36b. Amplifier G1 has positive and negative inputs connected respectively to head pins 23 and 24, and amplifier G2 has positive and negative inputs connected respectively to reference voltage input 36a and output 36b. Voltage input 36a preferably provides a ground (zero-volt) reference voltage. Matched resistors R15 and R16 are connected in series with respective matched current generators I4 and I5, forming two symmetrical branches which are connected in parallel between supply nodes VP and VN. Each branch includes a respective node N1 and N2 at the junction of its resistor and current generator. Amplifiers G1 and G2 have two outputs connected oppositely to nodes N1 and N2, so that their output currents oppose.

Specifically, amplifier G1 senses bias voltage Vb at head pins 23 and 24 and outputs a current which disrupts the balance between the two symmetrical branches. The disruption appears as a voltage difference between nodes N1 and N2. Amplifier K3, which has its two inputs coupled to nodes N1 and N2 and its outputs coupled to the negative input of amplifier G2, amplifies the voltage difference and drives amplifier G2 to produce an opposing current that restores the balance between the two branches. In steady state, the currents balance each other such that the differential voltage at the inputs of amplifier K3 is zero. This occurs when amplifier K3 outputs a single-ended (ground-referenced) voltage Vb' equal to the product of bias current Ib and head resistance Rh.

Figure 3:
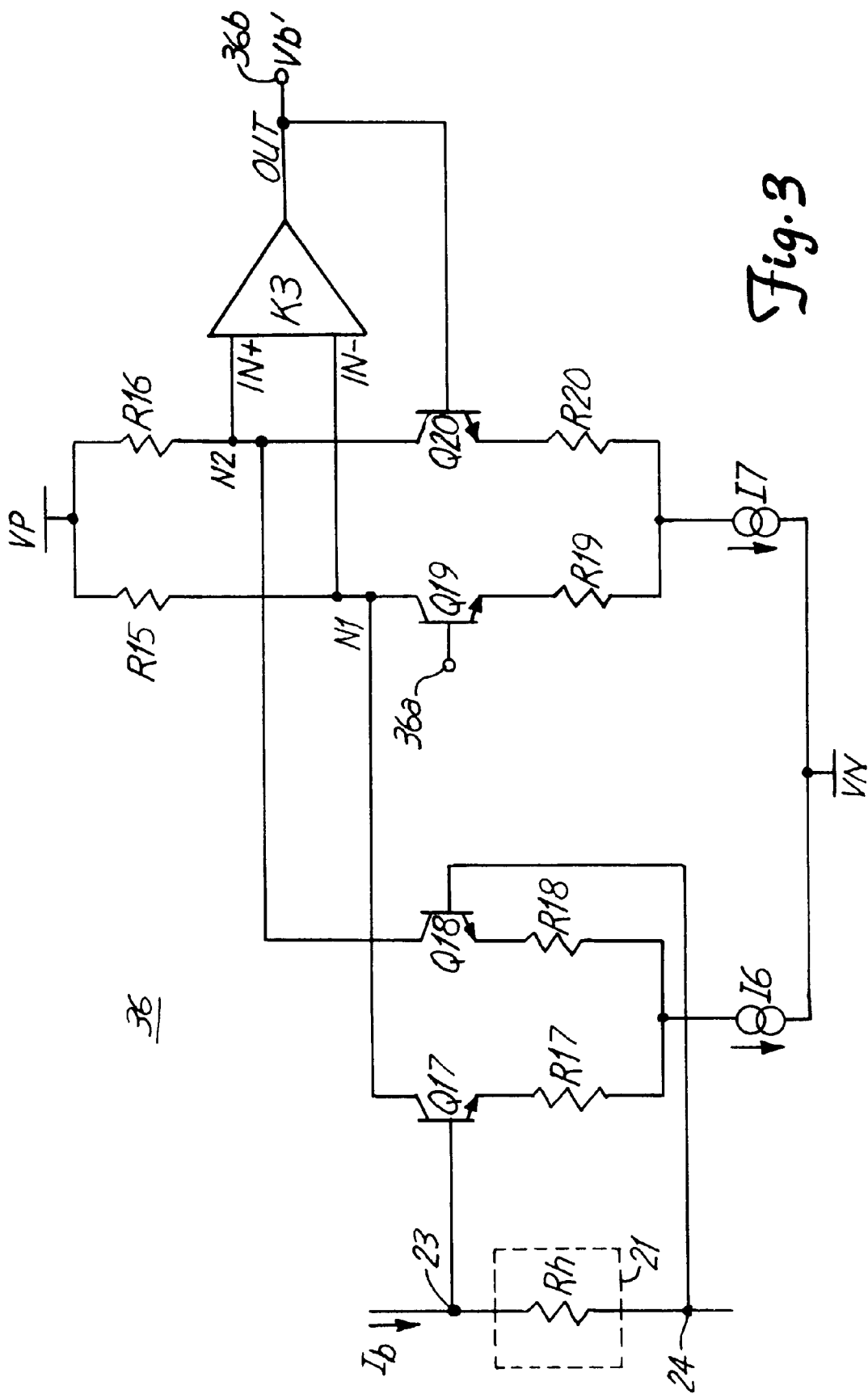
FIG. 3 is an electrical schematic showing more details of the voltage converter of FIG. 2.

FIG. 3 shows the preferred embodiments of transconductance amplifiers G1 and G2. Transconductance amplifier G1 comprises transistors Q17 and Q18, resistors R17 and R18, and current generator I6. Transistors Q17 and Q17 form a differential pair, with resistors R17 and R18 connected in series between their emitters for emitter degeneration. Current generator I6 is connected between negative supply pin VN and the junction of resistors R17 and R18. The bases and collectors of transistors Q17 and Q18 form respective input and output pairs of the amplifier. Similarly, amplifier G2 comprises transistors Q19 and Q20, current source I7, and resistors R19 and R20.

Although the present invention has been described with reference to preferred embodiments, workers skilled in the art will recognize that changes may be made in form and detail without departing from the spirit and scope of the invention. For example, one or more of the differential amplifiers could be replaced with non-differential amplifier circuit or with other amplifier topologies. These and other changes are within the spirit and scope of the invention as defined in the following claims.

What is claimed is:

1. A circuit for producing an output signal representative of changes of head resistance Rh of a magnetoresistive read head, the circuit comprising:

a current bias circuit for providing a bias current to the read head;

a first amplifier having an input for coupling to the read head, an output for outputting first signals representative of changes in the head resistance, at least one transistor having a temperature dependent characteristic and being coupled between the input and the output, so that the first signals having an amplitude substantially independent of the head resistance and proportional to the temperature dependent characteristic; and a second amplifier having an input coupled to the output of the first amplifier, and having an output for outputting an output signal having an amplitude proportional to the amplitude of the first signals and inversely proportional to the temperature dependent characteristic, whereby the amplitude of the output signal is substantially independent of head resistance and the temperature dependent characteristic.

2. The circuit of claim 1 wherein the first amplifier includes: first and second supply nodes;

the at least one transistor comprising first and second transistors each having a control region for coupling to the read head, and each having first and second controlled regions coupled between the first and second supply nodes; and a current generator coupled between a controlled region of the first transistor and the second supply node, with the current generator generating a current based on the head resistance of the magnetoresistive read head.

3. The circuit of claim 2 wherein the temperature dependent characteristic is based on a temperature dependent voltage Vt of the first and second transistors and wherein the first amplifier includes:

a reference voltage input coupled to the current generator for receiving a reference voltage V based on the head resistance Rh and the bias current Ib;

a first resistance coupled between the current generator and the second supply node, with the first resistance having a value R1 and the current generated by the current generator based on the ratio of the reference voltage V to the value R1; and a second resistance coupled between respective controlled regions of the first and second transistors, the second resistance having a value R2, wherein the first amplifier has a gain G1 based on:

$$Vt \frac{R1}{R2 Ib Rh}.$$

4. The circuit of claim 3 wherein the first amplifier includes:

a second reference voltage input; and third and fourth transistors each having a control region coupled to the second reference voltage input and each having respective first and second controlled regions coupled respectively between the first supply node and the first and second transistors to reduce input capacitance at the first and second inputs and thereby increase bandwidth of the circuit.

5. The circuit of claim 2 wherein the first amplifier includes:

a second current generator coupled between the second transistor and the second supply node, the second current generator generating a current based on the head resistance of the magnetoresistive read head.

6. The circuit of claim 1 wherein the output of the first amplifier is a differential output and wherein the second amplifier includes:

first and second supply nodes, a reference voltage input for receiving a reference voltage V;

first and second transistors each having a control region coupled to the differential output of the first amplifier, and each having first and second controlled regions coupled between the first and second supply nodes; and a current generator coupled between the second controlled regions of the first and second transistors and the second supply node, and coupled to the reference voltage input to generate a current based on the reference voltage V.

7. The circuit of claim 6 wherein the second amplifier includes:

first and second resistances coupled respectively between the first supply node and the first and second transistors, with each resistance having a value R1;

a third resistance coupled between the current generator and the second supply node and having a value R2, wherein the second amplifier has a gain G2 based on $$V \frac{R1}{R2 Vt},$$

wherein Vt is a temperature dependent voltage of the first and second transistors;

whereby adjusting the reference voltage V at the reference voltage input adjusts the amplitude of the output signal.

8. The circuit of claim 3 including a differential-to-single-ended voltage converter having first and second inputs for coupling to the read head and an output coupled to the reference voltage input for providing the reference voltage V based on the head resistance Rh and the bias current Ib.

9. The circuit of claim 8 wherein the voltage converter comprises:

a second reference voltage input for receiving a second reference voltage;

a first transconductance amplifier having first and second inputs for coupling to the read head, and having first and second outputs;

a second transconductance amplifier having first and second outputs connected to the respective first and second outputs of the first transconductance amplifier, and having first and second inputs, with the first input connected to the second reference voltage input; and a differential amplifier having first and second inputs connected to the respective first and second outputs of the second transconductance amplifiers, and having an output coupled to the second input of the second transconductance amplifier.

10. The circuit of claim 8 wherein the first and second transconductance amplifiers each comprise:

a differential transistor circuit having third and fourth transistors having respective bases, collectors, and emitters, with the bases coupled to the first and second inputs of the respective transconductance amplifier, and the collectors coupled to the respective first and second outputs of the respective transconductance amplifier; and first and second resistances coupled between the respective emitters of the third and fourth transistors.

11. A circuit for producing an output signal representative of changes of a head resistance Rh of a magnetoresistive read head, the circuit comprising:

first and second supply nodes;

a current bias circuit for providing a bias current Ib to the read head;

a first amplifier having first and second inputs for coupling to the read head, an output for outputting first signals representative of changes in the head resistance, with the first signals having an amplitude substantially independent of the head resistance, the first amplifier including:

first reference voltage input for receiving a reference voltage;

first and second transistors having respective first and second bases coupled to the first and second inputs, and having respective first and second controlled regions;

a resistance R2 coupled between the second controlled regions of the first and second transistors;

third and fourth transistors having respective third and fourth bases coupled to the reference voltage input and each having respective first and second controlled regions coupled respectively between the first supply node and the first and second transistors to reduce input capacitance at the first and second inputs and increase bandwidth of the circuit; and a current generator circuit having a resistance R1 and being coupled between the second controlled regions of the first and second transistors and the second supply node to bias the first and second transistors with a current based on the bias current Ib and the ratio of the head resistance Rh to the resistance R1, wherein the first if amplifier has a gain G1 based on:

$$Vt \frac{R1}{R2 Ib Rh}.$$

wherein Vt is a temperature dependent voltage of the first, second, third, and fourth transistors.

12. The circuit of claim 11 further including:
a second amplifier having an input coupled to the output of the first amplifier, and having an output for outputting an output signal having an amplitude proportional to the amplitude of the first signals and inversely proportional to the thermal voltage Vt, whereby the amplitude of the output signal is substantially independent of head resistance and the thermal voltage.

13. The circuit of claim 12 wherein the output of the first amplifier is a differential output and wherein the second amplifier includes:
a second reference voltage input for receiving a reference voltage V;
fifth and sixth transistors having respective fifth and sixth control nodes coupled to the differential output of the first amplifier, and each having respective first and second controlled regions coupled between the first and second supply nodes; and
a current generator coupled between the second controlled regions of the fifth and sixth transistors and the second supply node, and to the reference voltage second input to generate a current based on the reference voltage V.

14. The circuit of claim 13 wherein the second amplifier includes:
first and second resistances coupled respectively between the first supply node and the fifth and sixth transistors, with each resistance having a value R3;
a third resistance coupled between the current generator and the second supply node and having a value R4, wherein the second amplifier has a gain G2 based on $$V \frac{R3}{R4 Vt},$$

wherein Vt is a temperature dependent voltage of the first though sixth transistors; whereby adjusting the reference voltage V at the second reference voltage input adjusts the amplitude of the output signal.

* * * * *

UNITED STATES PATENT AND TRADEMARK OFFICE
CERTIFICATE OF CORRECTION

PATENT NO. : 5,914,630
DATED : JUNE 22, 1999
INVENTOR(S) : DOUGLAS R. PETERSON

It is certified that error appears in the above-identified patent and that said Letters Patent is hereby corrected as shown below:

Col. 3, line 55, delete "input", insert --inputs--  (first occurrence)

Signed and Sealed this

Eighth Day of February, 2000

Attest:

Q. TODD DICKINSON

Attesting Officer

Commissioner of Patents and Trademarks